United States Patent
Tokuno et al.

(10) Patent No.: US 7,238,571 B1
(45) Date of Patent: Jul. 3, 2007

(54) NON-VOLATILE MEMORY DEVICE WITH INCREASED RELIABILITY

(75) Inventors: Hirokazu Tokuno, Cupertino, CA (US); Wenmei Li, Sunnyvale, CA (US); Ning Cheng, San Jose, CA (US); Minh Van Ngo, Fremont, CA (US); Angela T. Hui, Fremont, CA (US); Cinti X. Chen, Fremont, CA (US)

(73) Assignees: Advanced Micro Devices, Inc., Sunnyvale, CA (US); Spansion LLC, Sunnyvale, CA (US)

( * ) Notice: Subject to any disclaimer, the term of this patent is extended or adjusted under 35 U.S.C. 154(b) by 114 days.

(21) Appl. No.: 11/063,560

(22) Filed: Feb. 24, 2005

(51) Int. Cl.
*H01L 29/80* (2006.01)
*H01L 31/112* (2006.01)

(52) U.S. Cl. .............. 438/258; 438/201; 257/315
(58) Field of Classification Search ............ 438/201, 438/258, 266, 288; 257/315, 316
See application file for complete search history.

(56) References Cited

U.S. PATENT DOCUMENTS 4,833,096 A * 5/1989 Huang et al. ............ 438/201

* cited by examiner

*Primary Examiner*—Phuc T. Dang
(74) *Attorney, Agent, or Firm*—Harrity Snyder LLP (57) ABSTRACT

A memory device may include a number of memory cells, a first interlayer dielectric formed over the memory cells and at least one metal layer formed over the interlayer dielectric. A dielectric layer may be formed over the metal layer. The dielectric layer may represent a cap layer formed at or near an upper surface of the memory device and may be deposited at a relatively low temperature.

18 Claims, 12 Drawing Sheets

NON-VOLATILE MEMORY DEVICE WITH INCREASED RELIABILITY

TECHNICAL FIELD

The present invention relates generally to semiconductor devices and methods of manufacturing semiconductor devices. The invention has particular applicability to memory devices and improving reliability for memory devices.

BACKGROUND ART

The escalating demands for high density and performance associated with non-volatile memory devices, such as electrically erasable programmable read only memory (EEPROM) devices, require small design features, high reliability and increased manufacturing throughput. The reduction of design features, however, challenges the limitations of conventional methodology. For example, the reduction of design features makes it difficult for the memory device to meet its expected data retention requirement.

In addition, various backend processes that are used to complete the formation of a working memory device often create problems associated with the operation of the memory device. For example, backend of line (BEOL) conductive interconnects, such as copper interconnects, often suffer from poor reliability due to, for example, electromigration. These problems often result in poor overall performance for the memory device and, ultimately, may lead to device failure.

DISCLOSURE OF THE INVENTION

Implementations consistent with the invention improve reliability in a memory device by depositing one or more dielectric layers at a relatively low temperature. Reducing the deposition temperature associated with these layers may result in less electromigration associated with one or more other structures in the memory device, such as metal interconnects.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect consistent with the invention, a memory device is provided. The memory device includes a substrate, a first dielectric layer formed over the substrate and a charge storage element formed over the first dielectric layer. The memory device also includes a second dielectric layer formed over the charge storage element, a control gate formed over the second dielectric layer and a third dielectric layer formed over the control gate. The memory device further includes at least one metal layer formed over the third dielectric layer and a fourth dielectric layer formed over the at least one metal layer, where the fourth dielectric layer is deposited at a temperature of less than about 400° C.

According to another aspect consistent with the invention, a method of manufacturing a semiconductor device is provided. The method includes forming a number of memory cells, where each memory cell includes a charge storage element and a control gate. The method also includes forming a first dielectric over the control gate and forming at least one metal layer over the first dielectric. The method further includes depositing a second dielectric over the at least one metal layer at a temperature of less than about 400° C.

According to a further aspect consistent with the invention, a non-volatile memory device is provided. The non-volatile memory device includes a number of memory cells, a first interlayer dielectric formed over the memory cells and a first metal layer formed over the first interlayer dielectric. The non-volatile memory device further includes a second interlayer dielectric formed over the first metal layer and a second metal layer formed over the second interlayer dielectric. The non-volatile memory device further includes a dielectric layer formed over the second metal layer at a temperature of less than about 400° C.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Figure 1:
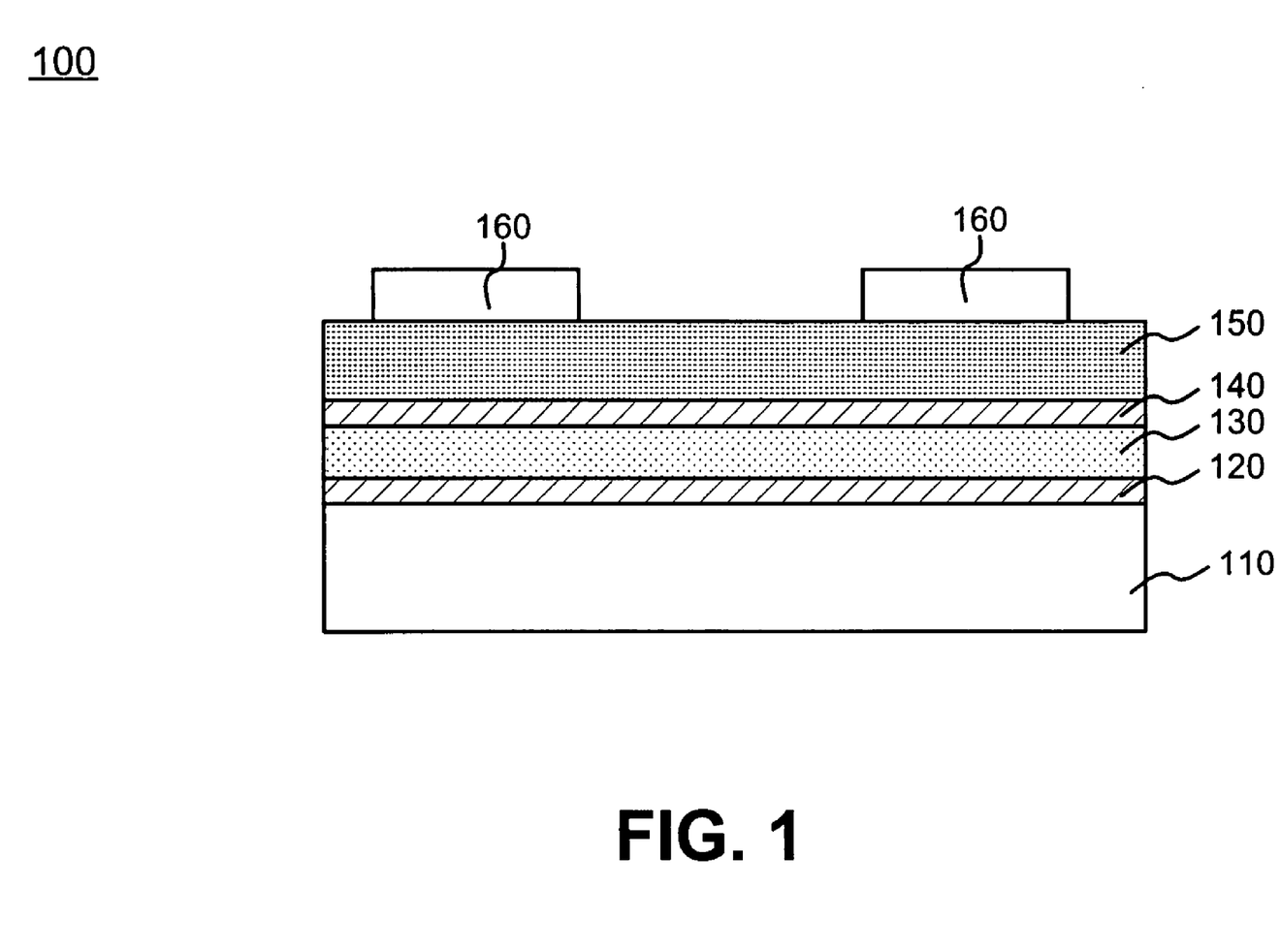
FIG. 1 is a cross-section illustrating exemplary layers used to form memory cells in accordance with an embodiment of the invention.

FIG. 1 illustrates the cross-section of a semiconductor device 100 formed in accordance with an embodiment of the invention. Referring to FIG. 1, semiconductor device 100 may include layers 110, 120, 130, 140 and 150. In an exemplary embodiment, layer 110 may be a substrate of semiconductor device 100 and may include silicon, germanium, silicon-germanium or other semiconducting materials. In alternative implementations, layer 110 may be a conductive layer or a dielectric layer formed a number of layers above the surface of a substrate in semiconductor device 100.

Layer 120 may be a dielectric layer formed on layer 110 in a conventional manner. In an exemplary implementation, dielectric layer 120 may include an oxide, such as a silicon oxide (e.g., $SiO_2$), and may have a thickness ranging from about 20 Å to about 100 Å. Dielectric layer 120 may function as a tunnel oxide layer for a subsequently formed memory cell of semiconductor device 100.

Layer 130 may be formed on layer 120 in a conventional manner and may include a dielectric material, such as a nitride (e.g., a silicon nitride). Layer 130, consistent with the invention, may act as a charge storage layer for semiconductor device 100 and may have a thickness ranging from about 70 Å to about 300 Å. In alternative implementations, layer 130 may include a conductive material, such as polycrystalline silicon, used to form a floating gate electrode.

Layer 140 may be formed on layer 130 in a conventional manner and may include a dielectric material, such as an oxide (e.g., $SiO_2$). Alternatively, layer 140 may include another dielectric material, such as a silicon oxynitride, that may be deposited or thermally grown on layer 130. In still other alternatives, layer 140 may be a composite that includes a number of dielectric layers or films. Layer 140 may have a thickness ranging from about 30 Å to about 150 Å and may function as an inter-gate dielectric for memory cells in semiconductor device 100.

Layer 150 may include a conductive material, such as polycrystalline silicon, formed on layer 140 in a conventional manner. Alternatively, layer 150 may include other semiconducting materials, such as germanium or silicon-germanium, or various metals, such as titanium or tungsten. Layer 150, consistent with the invention, may be used to form one or more control gate electrodes for one or more memory cells in semiconductor device 100. In an exemplary implementation, layer 150 may have a thickness ranging from about 500 Å to about 3000 Å. An optional silicide layer, such as titanium silicide (not shown) may be formed on layer 150.

A photoresist material may be patterned and etched to form masks 160 on the top surface of layer 150, as illustrated in FIG. 1. Masks 160 may be used to facilitate formation of one or memory cells in semiconductor device 100, as described in more detail below.

Figure 2:
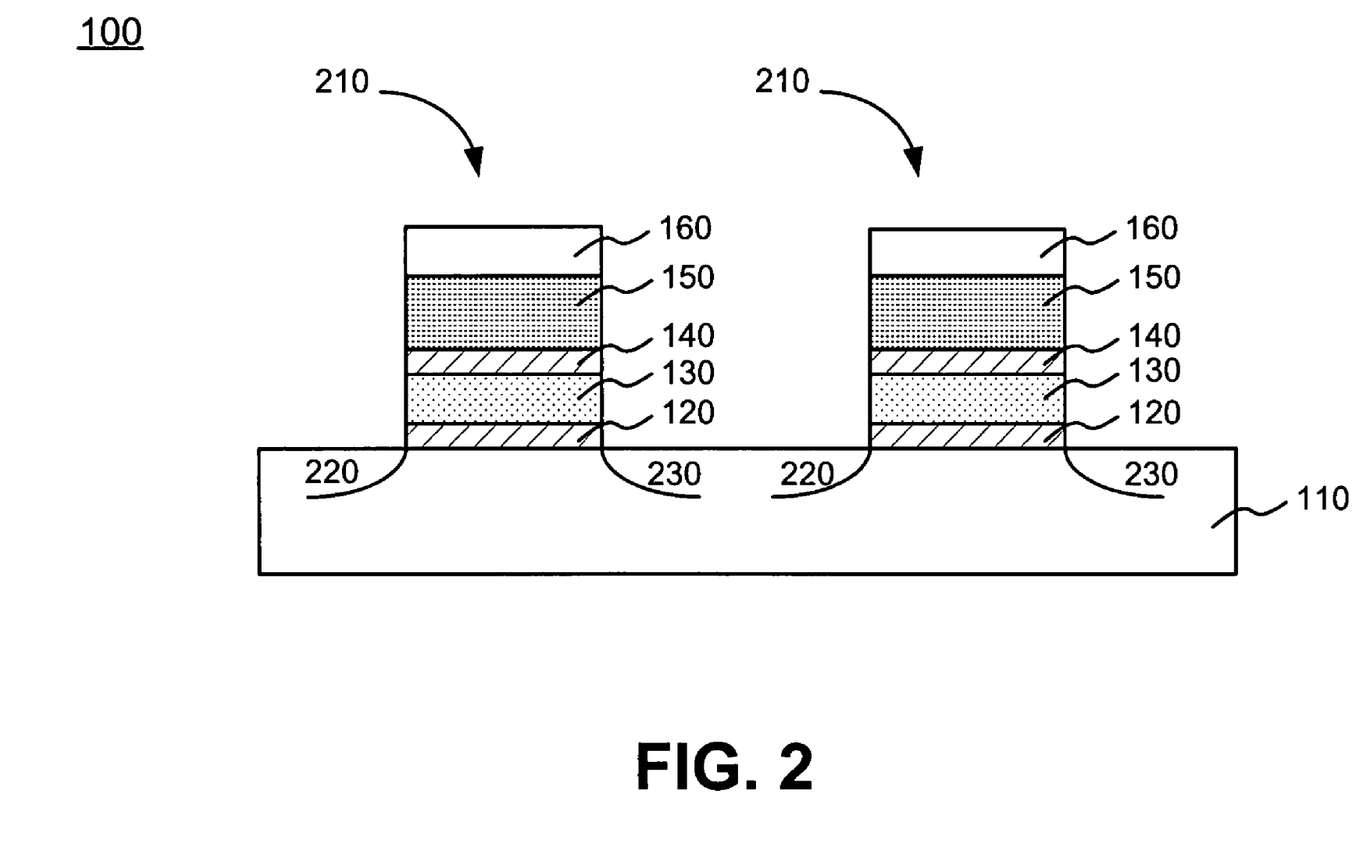
FIG. 2 is a cross-section illustrating the formation of memory cells in accordance with an embodiment of the invention.

Semiconductor device 100 may then be etched, as illustrated in FIG. 2. Referring to FIG. 2, layers 120–150 may be etched in a conventional manner with the etching terminating at substrate 110, thereby forming structures 210. Each structure 210 (also referred to herein as a memory cell 210) may represent a memory cell of semiconductor device 100, where each memory cell 210 includes a dielectric layer 120, a charge storage layer 130, an inter-gate dielectric layer 140 and a control gate electrode 150. Only two memory cells 210 are illustrated in semiconductor device 100 in FIG. 2 for simplicity. It should be understood that semiconductor device 100 may typically include a memory array including a large number of memory cells 210.

In an exemplary implementation consistent with the invention, each memory cell 210 may be a SONOS-type memory cell, with a silicon control gate electrode 150 formed on an oxide-nitride-oxide (ONO) stack (i.e., layers 140, 130 and 120), with nitride layer 130 acting as a charge storage layer, and the ONO stack being formed on a silicon substrate 110.

Source and drain regions 220 and 230 may then be formed in substrate 110, as illustrated in FIG. 2. For example, n-type or p-type impurities may be implanted in substrate 110 to form source and drain regions 220 and 230, based on the particular end device requirements. In one implementation, an n-type dopant, such as phosphorous or arsenic, may be implanted at a dosage ranging from about $1\times10^{13}$ atoms/$cm^2$ to about $1\times10^{15}$ atoms/$cm^2$ and an implantation energy ranging from about 10 KeV to about 70 KeV. Alternatively, a p-type dopant, such as boron, may be implanted at similar dosages and implantation energies. The particular implantation dosages and energy used to form source and drain regions 220 and 230 may be selected based on the particular end device requirements. One of ordinary skill in the art would be able to optimize the source/drain implantation process based on the particular circuit requirements. It should also be understood that source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Figure 3:
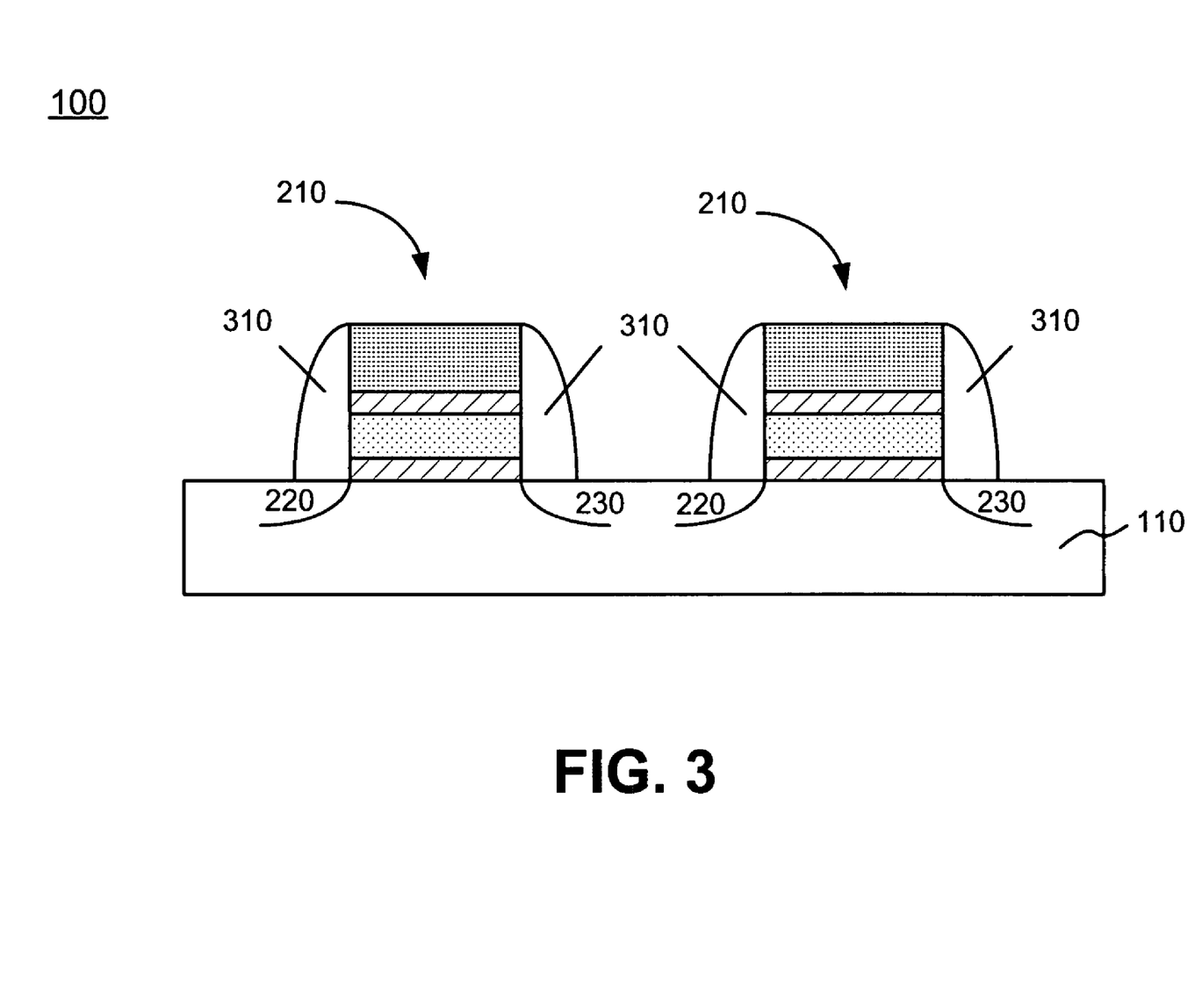
FIG. 3 is a cross-section illustrating the formation of spacers on the device of FIG. 2 in accordance with an embodiment of the invention.

Photoresist masks 160 may be removed using a conventional process. Spacers 310 may be formed adjacent the sidewalls of the memory cells 210, as illustrated in FIG. 3. For example, a dielectric material, such as a silicon oxide, a silicon oxynitride or another dielectric material, may be deposited and etched to form spacers 310 on each side of memory cells 210. Spacers 310 may be used to electrically isolate adjacent memory cells 210 from each other. Spacers 310 may also be used to facilitate the deposition of impurities in semiconductor device 100.

Figure 4A:
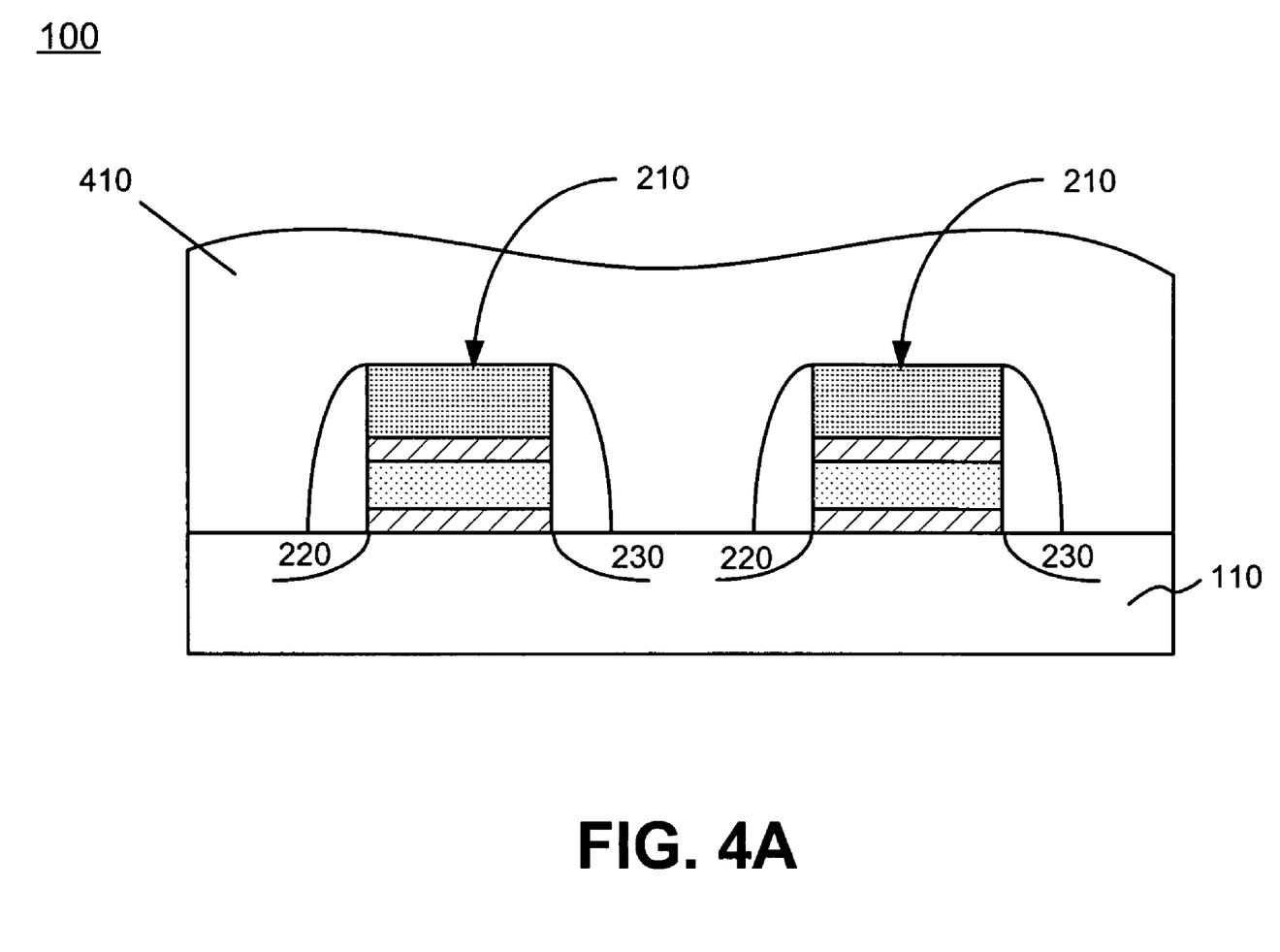
FIG. 4A is a cross-section illustrating the formation of an interlayer dielectric on the device of FIG. 3 in accordance with an embodiment of the invention.

A dielectric layer 410 may then be deposited over semiconductor device 100, as illustrated in FIG. 4A. Dielectric layer 410, also referred to as interlayer dielectric (ILD) 410) may have a thickness ranging from about 3,000 Å to about 15,000 Å and may act as an ILD for semiconductor device 100. ILD 410, may include, for example, a phoshphosilicate glass (PSG) material, a boro-phosphosilicate glass (BPSG) material, an oxide or some other dielectric material.

Figure 4B:
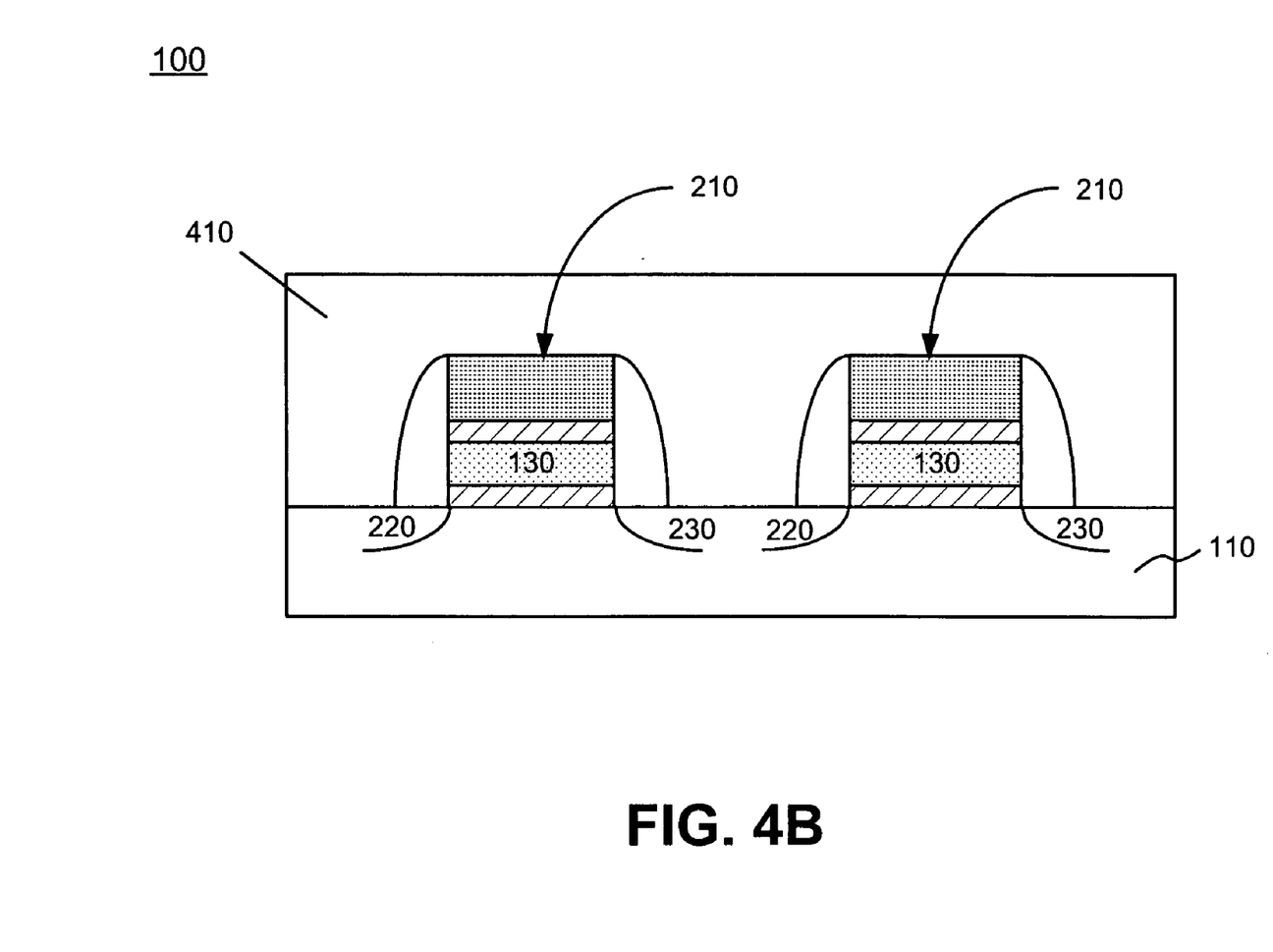
FIG. 4B is a cross-section illustrating the planarization of the interlayer dielectric of FIG. 4A in accordance with an embodiment of the invention.

ILD 410 may optionally be planarized using a conventional process, such as a chemical-mechanical polishing (CMP) process, as illustrated in FIG. 4B. Referring to FIG. 4B, the CMP process may planarize the top surface of ILD 410 to facilitate formation of subsequent structures, such as interconnect lines. ILD 410, consistent with the invention, may represent an ILD located closest to substrate 110. In alternative implementations, ILD 410 may represent an interlayer dielectric formed a number of layers above the surface of substrate 110. In each case, ILD 410 functions to isolate various conductive structures, such as various interconnect lines described below or to isolate source region 220 or drain region 230 from other conductive structures.

Figure 5A:
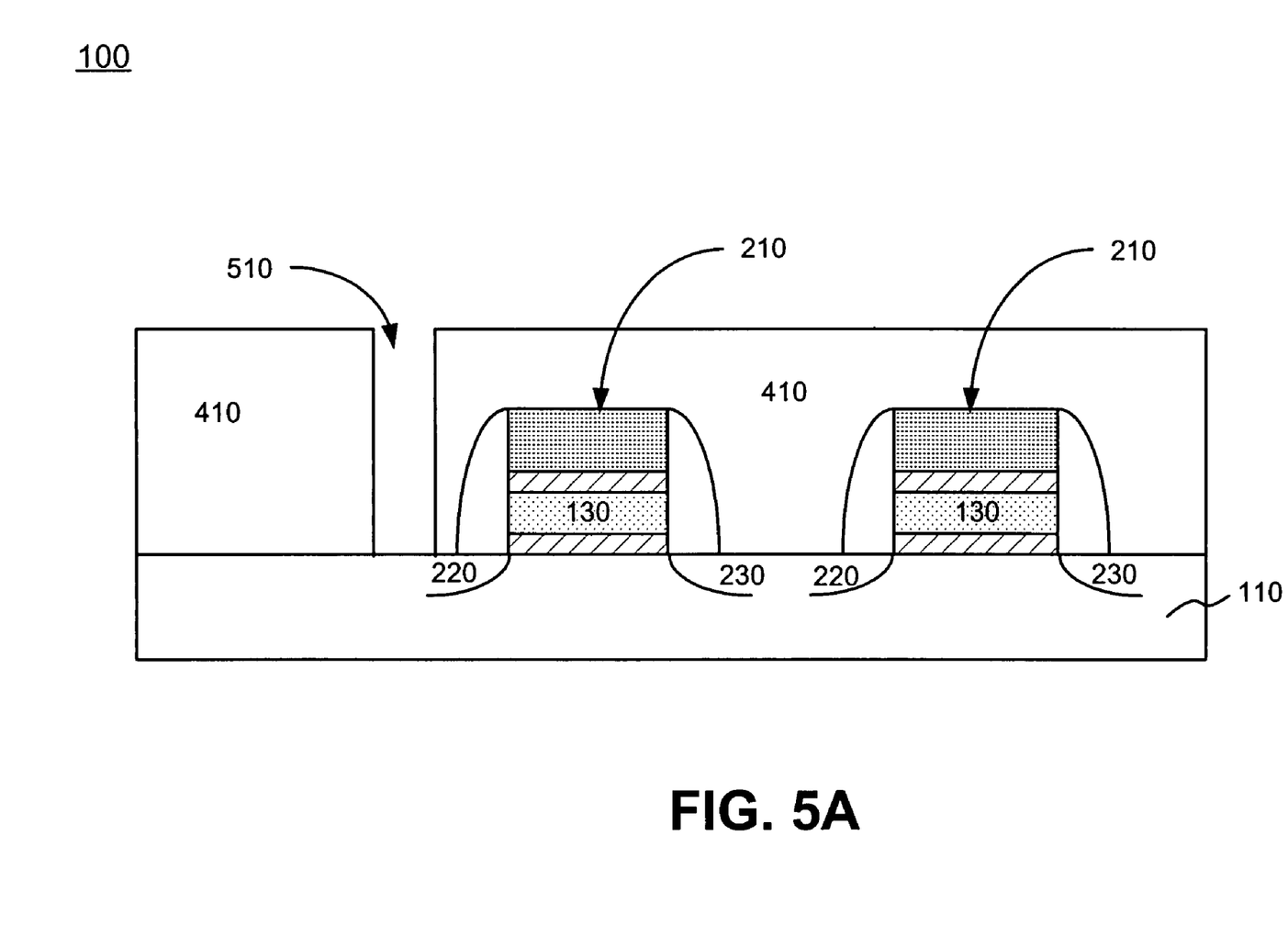
FIG. 5A is a cross-section illustrating the formation of a trench in the interlayer dielectric of FIG. 4B in accordance with an embodiment of the invention.
Figure 5B:
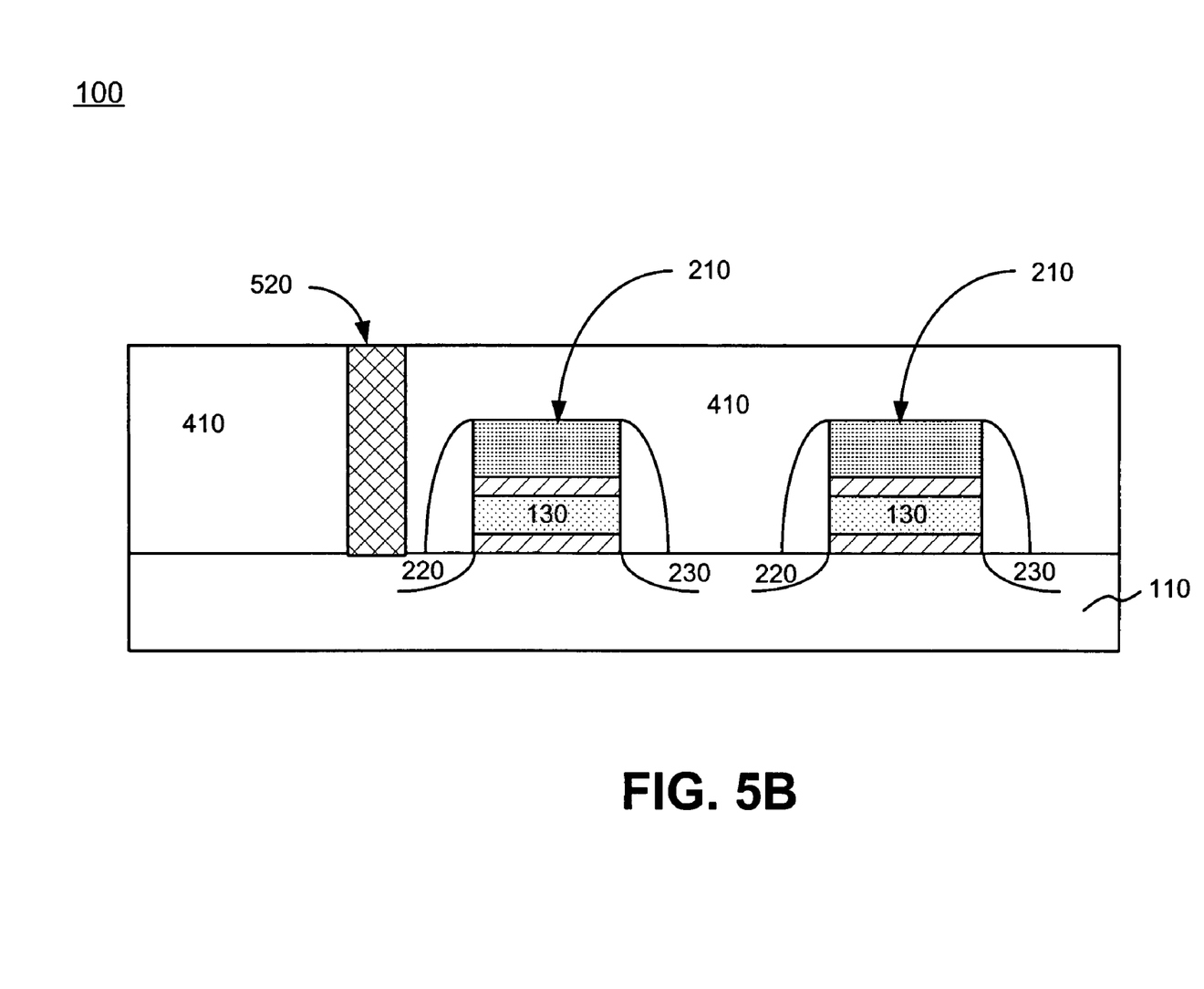
FIG. 5B illustrates the formation of a contact in the trench of FIG. 5A in accordance with an embodiment of the invention.

A trench 510 may be formed in ILD 410 using conventional photolithographic and etching techniques, as illustrated in FIG. 5A. Trench 510 may be used to form a contact to source region 220 or drain region 230. Next, a metal layer 520, such as copper or aluminum, may be deposited to fill trench 510, as illustrated in FIG. 5B. Metal layer 520 may represent a contact to, for example, source region 220.

Figure 6:
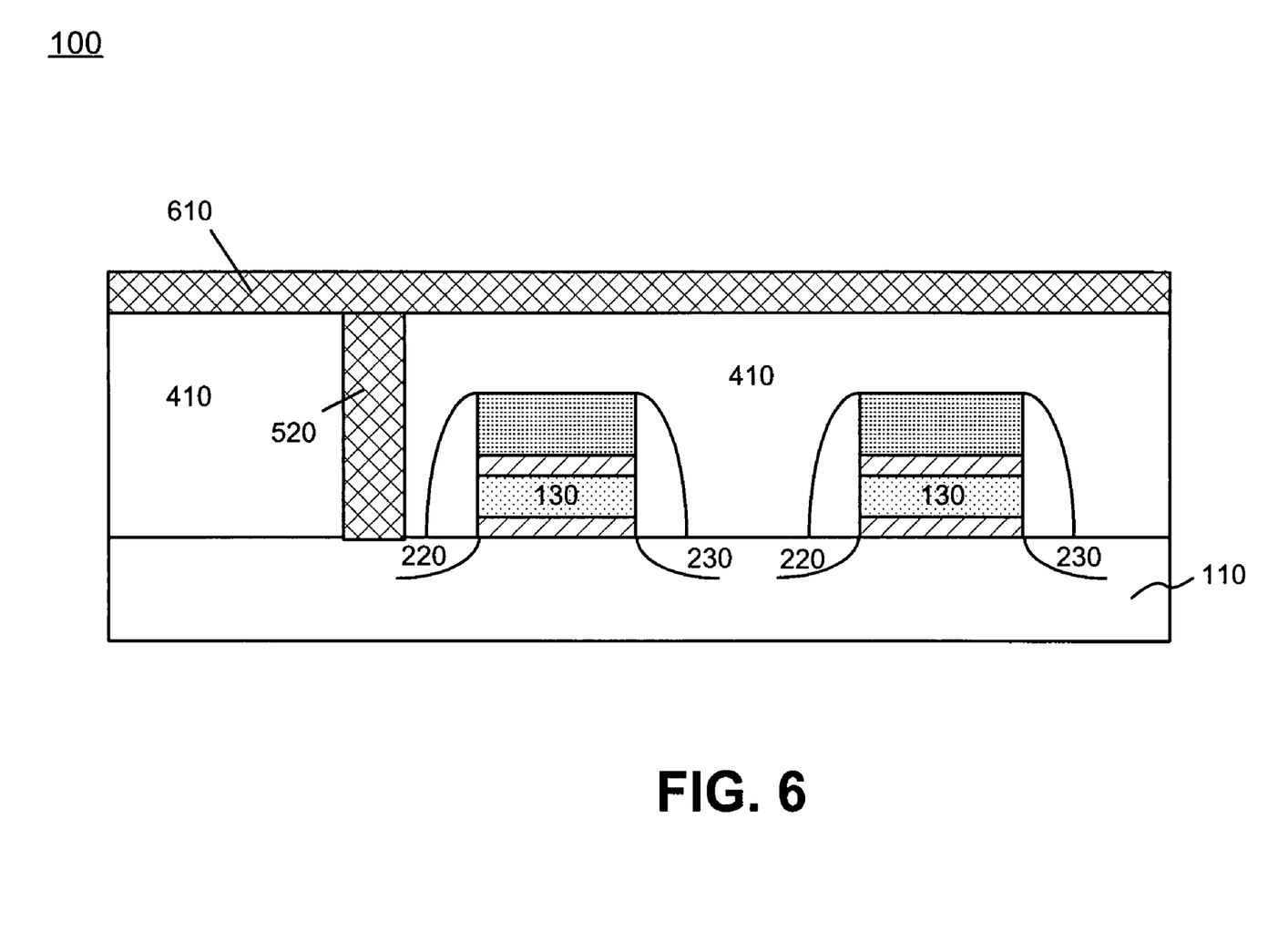
FIG. 6 illustrates the formation of a conductive interconnect on the device of FIG. 5B in accordance with an embodiment of the invention.

A conductive interconnect line 610 may then be formed over the planarized top surface of ILD 410, as illustrated in FIG. 6. For example, a metal, such as copper or aluminum, may be deposited to form conductive line 610 that connects various features in semiconductor device 100, such as source or drain regions 220/230 through contact 520 to an external electrode (not shown). Alternatively, conductive line 610 may connect various memory cells 210 in semiconductor device 100. Conductive line 610 may facilitate programming or erasing various memory cells 210 in semiconductor device 100.

Figure 7:
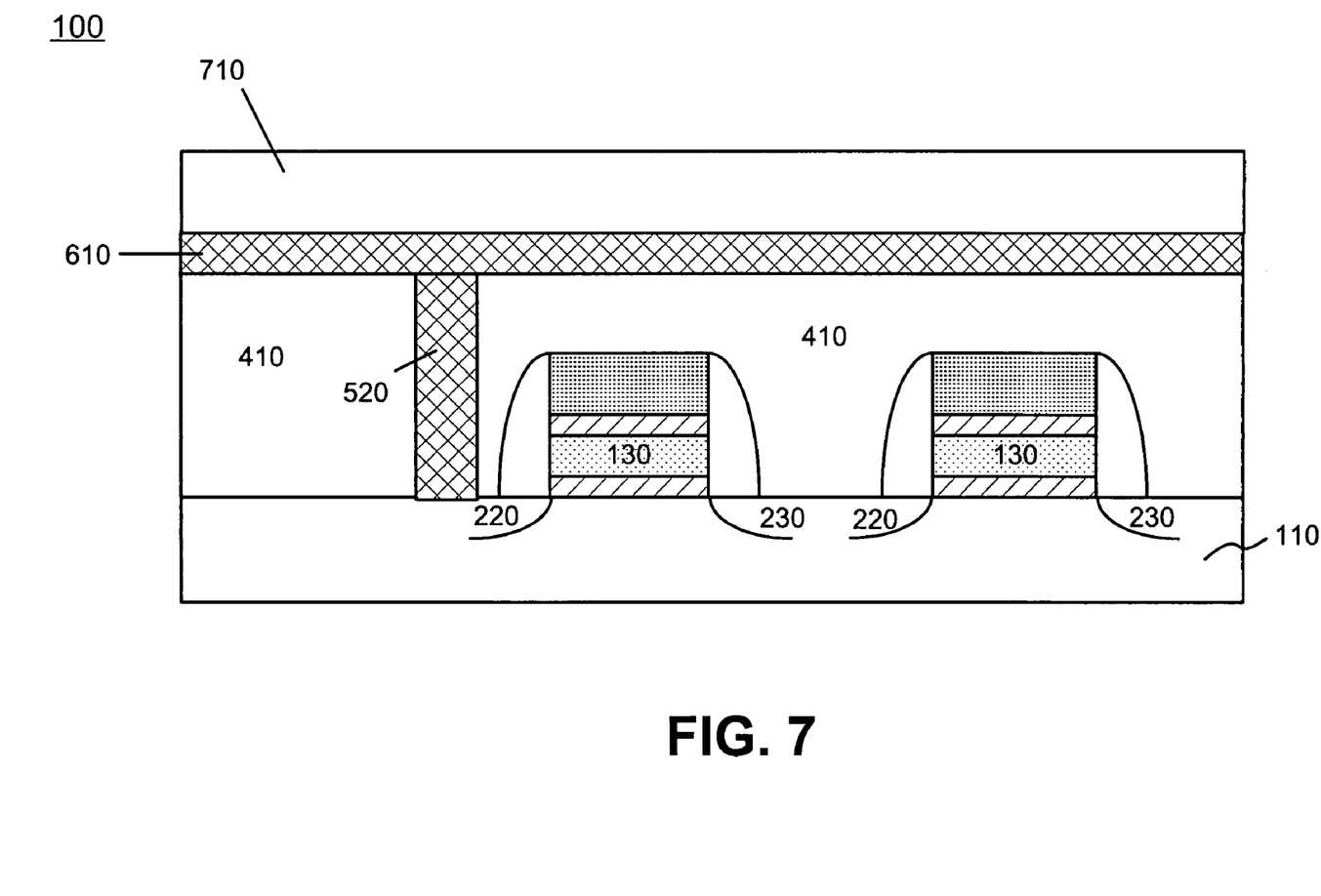
FIG. 7 illustrates the formation of an interlayer dielectric on the device of FIG. 6 in accordance with an embodiment of the invention.

An ILD 710 may be formed over conductive line 610, as illustrated in FIG. 7. ILD 710, consistent with the invention, may include an oxide, such as $SiO_2$ or a silicon rich oxide, a PSG material, a BSPG material, a silicon oxynitride (SiON), a silicon oxycarbide (SiOC), a silicon carbonitride (SiCN), a hydrogenated silicon oxycarbide (SiCOH), or some combination of these or other dielectric materials. ILD 710 may be deposited to a thickness ranging from about 100 Å to about 5,000 Å.

In an exemplary embodiment, ILD 710 may be deposited using a chemical vapor deposition (CVD) process performed at a relatively low temperature. For example, ILD 710 may be deposited using a CVD process at a temperature ranging from about 25° C. to about 385° C. It has been found that depositing ILD 710 using a relatively low temperature, e.g., less than about 400° C., reduces problems associated with conductive lines, such as conductive line 610. In an exemplary implementation in which conductive line 610 is formed of copper or a copper alloy, ILD 710 may be deposited at about 350° C. Depositing ILD 710 at such a temperature has been found to reduce electromigration problems associated with conductive line 610.

Figure 8:
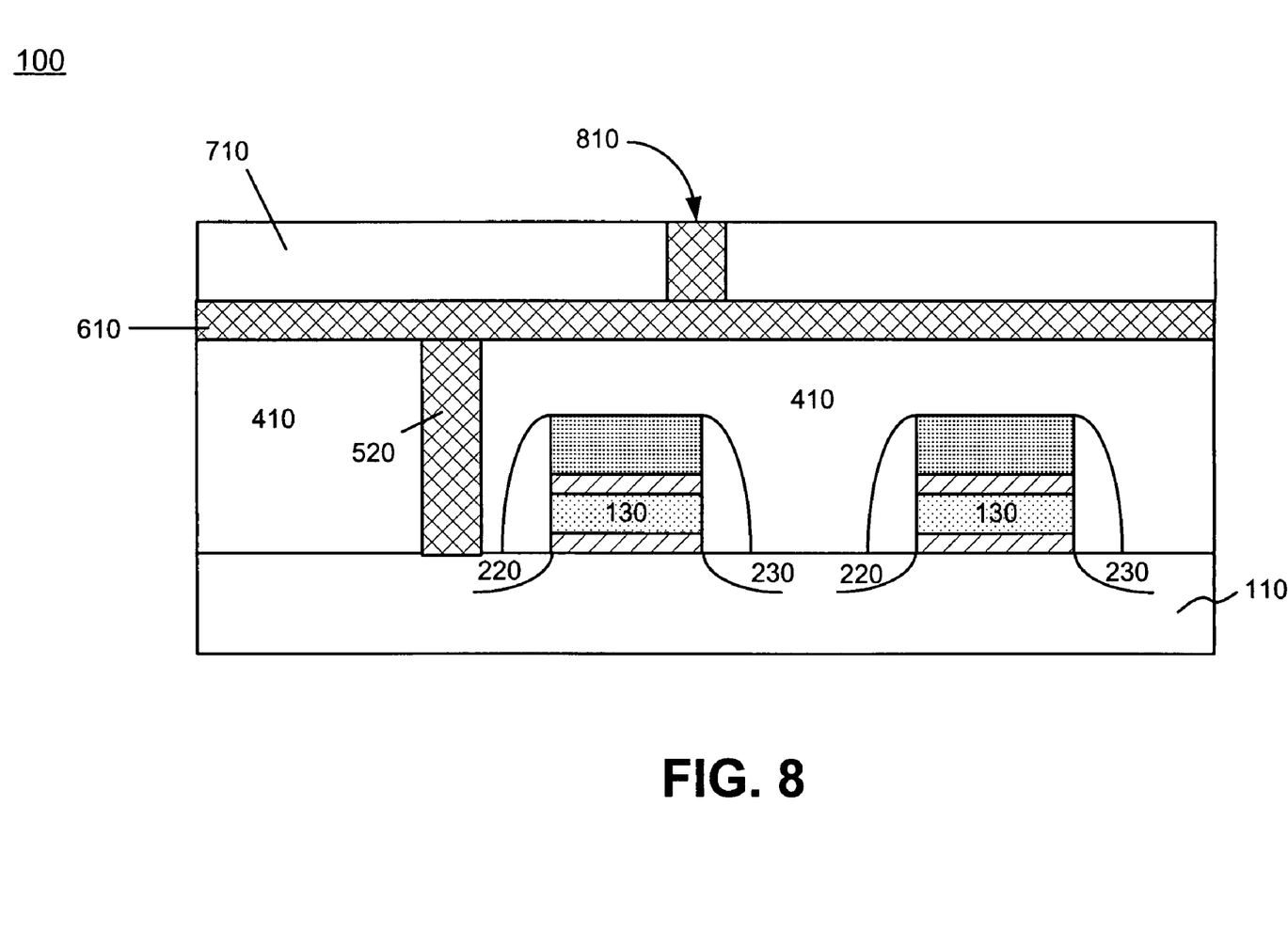
FIG. 8 illustrates the formation of a contact in the interlayer dielectric of FIG. 7 in accordance with an embodiment of the invention.

As described above, various BEOL processing may be performed to complete the fabrication of semiconductor device 100. For example, a trench may be formed in ILD 710 followed by deposition of a metal layer 810, such as copper or aluminum, as illustrated in FIG. 8. Metal layer 810 may represent a contact to an uppermost conductive layer of semiconductor device 100. Alternatively, metal layer 810 may represent a contact to any one of a number of conductive layers in semiconductor device 100.

Figure 9:
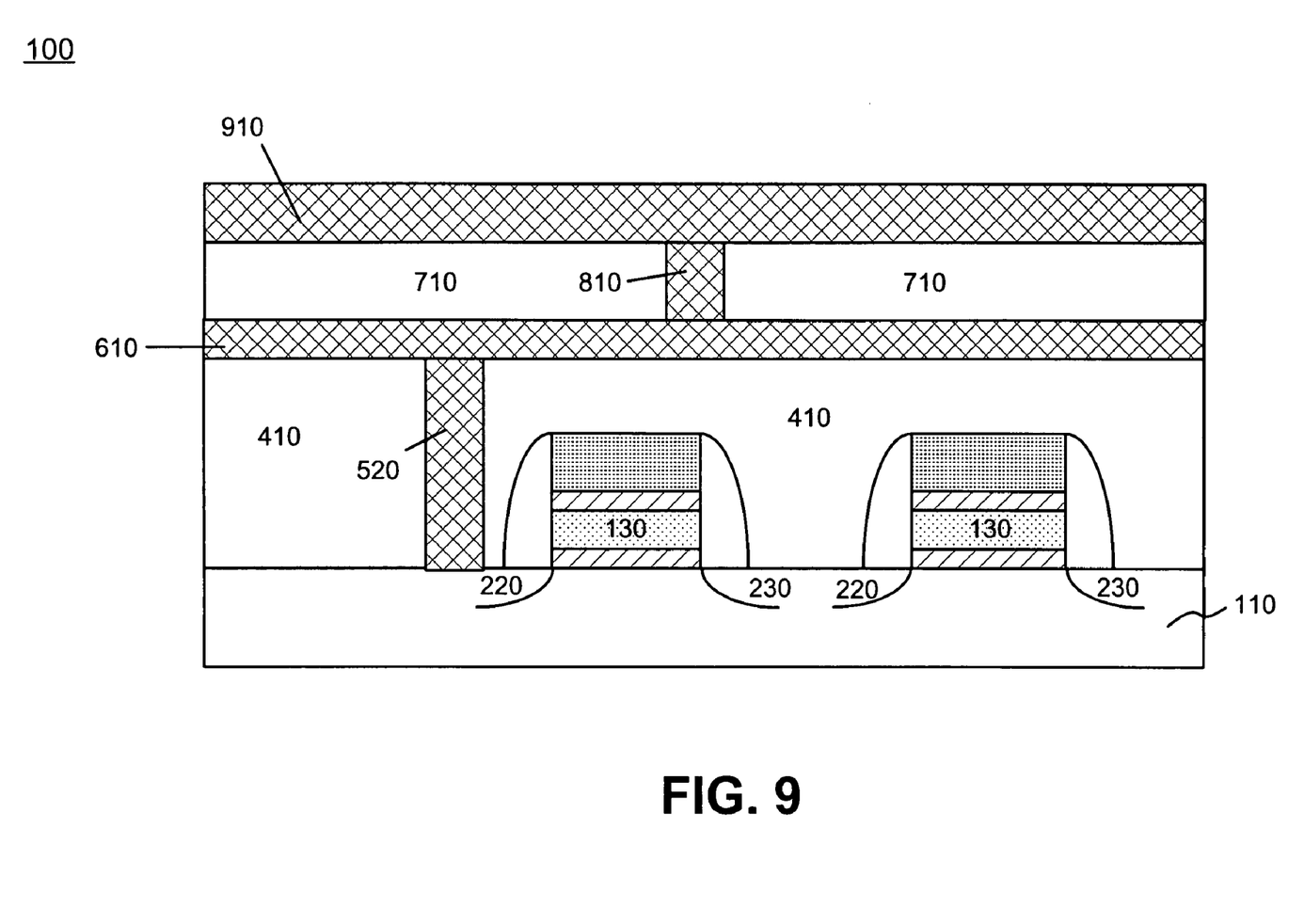
FIG. 9 illustrates the formation of a conductive layer on the device of FIG. 8 in accordance with an embodiment of the invention.

A conductive layer may then be formed over ILD 710. For example, a metal, such as copper or aluminum, may be deposited to form conductive line 910, as illustrated in FIG. 9. Conductive line 910 may represent a BEOL structure or connector that connects various features in semiconductor device 100, such as source or drain regions 220/230 to an external electrode (not shown), to facilitate programming or erasing of various memory cells 210 in semiconductor device 100.

Figure 10:
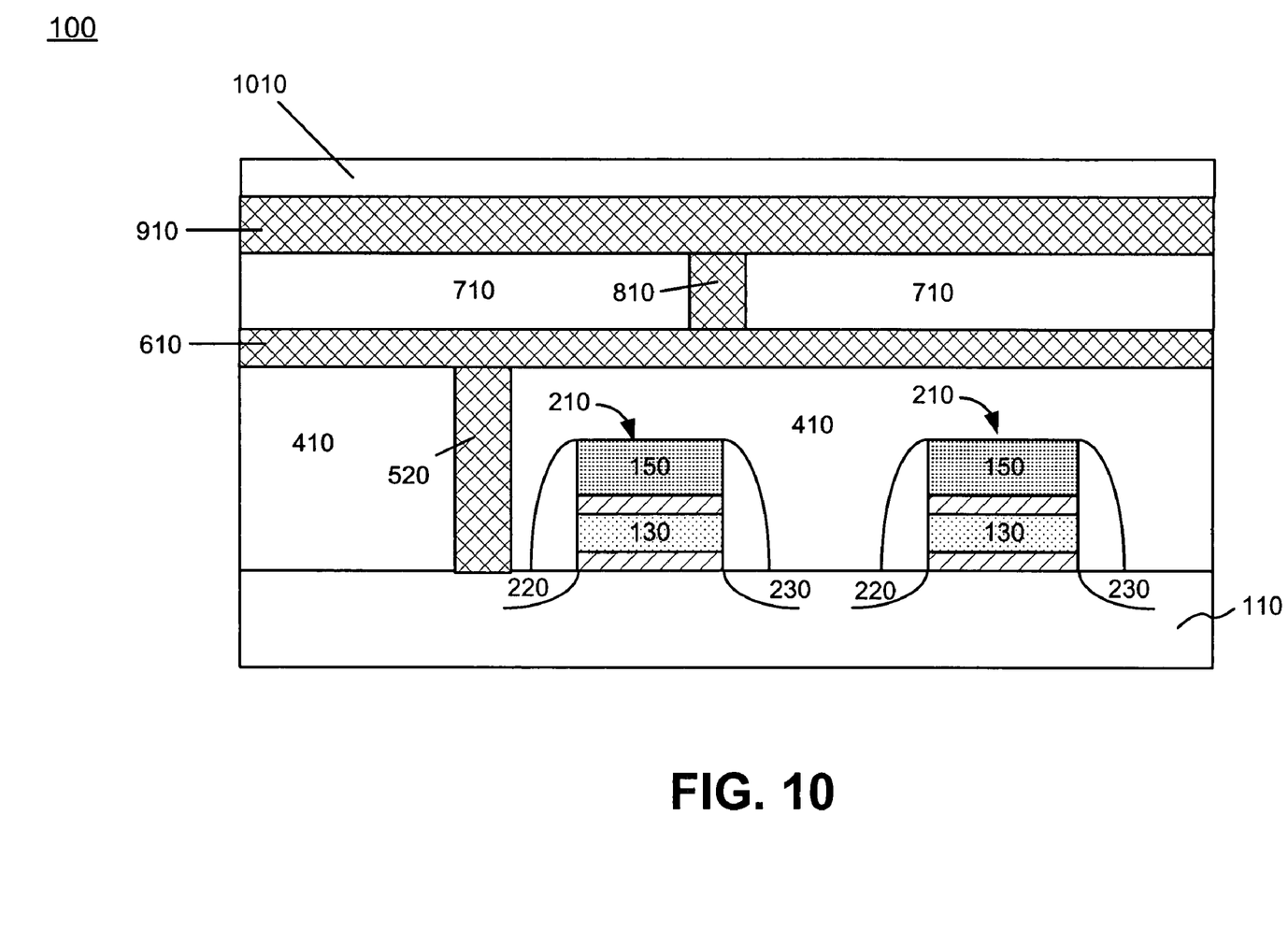
FIG. 10 illustrates the formation of a dielectric layer on the device of FIG. 9 in accordance with an embodiment of the invention.

A top dielectric layer 1010, also referred to as cap layer 1010, may be formed over conductive line 910 and may act as a protective layer to prevent damage to conductive line 910 and other portions of semiconductor device 100 during subsequent processing. For example, dielectric layer 1010 may protect semiconductor device 100 against impurity contamination during subsequent cleaning processes that may be used to complete a working memory device.

In an exemplary embodiment, cap layer 1010 may be an oxide, such as $SiO_2$, a silicon rich oxide, an SiON, an SiOC, an SiCN, an SiCOH or some combination of these or other dielectric materials. Cap layer 1010 may be deposited to a thickness ranging from about 3,000 Å to about 20,000 Å.

In an exemplary embodiment, cap layer 1010 may be deposited using a CVD process performed at a relatively low temperature. For example, similar to ILD 710, cap layer 1010 may be deposited using a CVD process performed at a temperature ranging from about 25° C. to about 385° C. Similar to the discussion above with respect to ILD 710, depositing cap layer 1010 using a relatively low temperature, e.g., less than about 400° C., reduces electromigration problems associated with conductive lines, such as conductive line 910. In an exemplary implementation in which conductive line 910 is formed of copper or a copper alloy, cap layer 1010 may be deposited at about 350° C. Depositing cap layer 1010 at such a temperature reduces electromigration problems associated with conductive line 910, as well as other conductive structure in semiconductor device 100.

While only two conductive layers (i.e., layers 610 and 910) are illustrated in FIG. 10 for simplicity, it should be understood that semiconductor device 100 may include more conductive layers and ILD layers based on the particular circuit requirements. In each case, one or more dielectric layers, such as cap layer 1010 and/or one or more of the ILDs may be deposited at relatively low temperatures to reduce electromigration problems associated with metal structures in semiconductor device 100.

As described above, in an exemplary embodiment, semiconductor device 100 illustrated in FIG. 10 may be a SONOS type memory device, with nitride layer 130 acting as a charge storage element for each memory cell 210. Each memory cell 210 may be an EEPROM type memory device and one or more programming circuits (not shown) may be used to facilitate programming and erasing of one or more memory cells 210 of semiconductor device 100. Programming of memory cell 210 may be accomplished by applying a voltage of, for example, of about 6 volts to 12 volts to control gate 150. Once programmed, electrons remain trapped in nitride layer 130 until an erase procedure is performed In an exemplary implementation consistent with the invention, each of memory cells 210 illustrated in FIG. 10 may be configured to store two bits of data. That is, charge storage layer 130 may be programmed to store two separate bits of data by localizing the first and second charges to the respective left and right sides of charge storage layer 130 illustrated in FIG. 10. For example, each of the two bits of memory cell 210 may be programmed independently by, for example, channel hot electron injection, to store a bit on each respective side of the charge storage layer 130. In this manner, the charges in charge storage layer 130 become effectively trapped on each respective side of charge storage layer 130. Erasing of each bit in memory cell 210 may also be performed independently. During erasing, the bits stored in charge storage layer 130 may tunnel through dielectric layer 120 into the source region 220 and drain region 230, respectively.

In this manner, the density of the array of memory cells 210 in semiconductor device 100 may be increased as compared to conventional memory devices that store only one bit of data per cell. In alternative implementations, each memory cell 210 may be configured to store one bit of data per memory cell 210. In addition, in alternative implementations, semiconductor device 100 may be a floating gate memory device in which layer 130 is formed from a conductive material, such as polysilicon, and functions as a charge storage element for each memory cell 210.

In summary, implementations consistent with the invention deposit one or more dielectric layers using a relatively low temperature process. Depositing such layers at lower temperatures reduces problems, such as electromigration problems, associated with various conductive structures in semiconductor device 100 and thereby increases reliability of semiconductor device 100.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of CVD processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of manufacturing a semiconductor device, comprising:
   forming a plurality of memory cells, each of the memory cells comprising a charge storage element and a control gate;
   forming a first dielectric over the control gate;
   forming at least one metal layer over the first dielectric; and
   depositing a second dielectric over the at least one metal layer at a temperature of less than about 400° C.,
   wherein the forming at least one metal layer comprises forming a first copper layer and a second copper layer, the method further comprising:
   forming an interlayer dielectric between the first and second copper layers at a temperature of less than about 400° C.

2. The method of claim 1, wherein the second dielectric comprises at least one of an oxide, a silicon rich oxide, a silicon oxynitride, a silicon oxycarbide, a silicon carbonitride or a hydrogenated silicon oxycarbide.

3. The method of claim 1, wherein the depositing the second dielectric comprises:
   depositing the second dielectric at a temperature of less than 350° C.

4. A method of forming a memory device, comprising:
   forming a first dielectric layer formed over a substrate;
   forming a charge storage element formed over the first dielectric layer;
   forming a second dielectric layer formed over the charge storage element;
   forming a control gate over the second dielectric layer;
   forming a third dielectric layer formed over the control gate;
   depositing at least one copper layer over the third dielectric layer; and
   depositing a fourth dielectric layer at a temperature ranging from about 25° C. to about 385° C. over the at least one copper layer, the fourth dielectric layer comprising a cap layer for the memory device.

5. The method of claim 4, wherein the depositing a fourth dielectric layer comprises depositing at least one of an oxide, a silicon rich oxide, a silicon oxynitride, a silicon oxycarbide, a silicon carbonitride or a hydrogenated silicon oxycarbide.

6. The method of claim 4, wherein the depositing a fourth dielectric layer comprises depositing the fourth dielectric layer at a temperature of about 350° C.

7. The method of claim 4, wherein the depositing at least one copper layer comprises:
   depositing a first copper layer and a second copper layer, the first copper layer being deposited over the third dielectric layer, the method further comprising:
   forming an interlayer dielectric between the first and second copper layers.

8. The method of claim 7, wherein the forming an interlayer dielectric comprises:
   depositing the interlayer dielectric at a temperature of less than 400° C.

9. The method of claim 4, wherein the cap layer is formed at or near an upper surface of the memory device.

10. The method of claim 4, wherein the forming a charge storage element comprises forming a nitride charge storage element.

11. A method of forming a non-volatile memory device, comprising:
    forming a plurality of memory cells;
    forming a first interlayer dielectric over the plurality of memory cells;
    depositing a first metal layer over the first interlayer dielectric;
    forming a second interlayer dielectric over the first metal layer at a temperature of less than about 400° C.;
    depositing a second metal layer over the second interlayer dielectric; and
    forming a dielectric layer over the second metal layer at a temperature of less than about 400° C.

12. The method of claim 11, wherein the forming a first metal layer comprises depositing a first copper layer.

13. The method of claim 12, wherein the forming a second metal layer comprises depositing a second copper layer.

14. The method of claim 11, wherein the forming a dielectric layer comprises forming a cap layer at or near an upper surface of the non-volatile memory device.

15. The method of claim 11, wherein the forming a dielectric layer comprises forming a cap layer for the non-volatile memory device to a thickness ranging from about 3,000 Å to about 20,000 Å.

16. The method of claim 11, wherein the forming a dielectric layer comprises forming at least one of a silicon oxynitride, a silicon oxycarbide, a silicon carbonitride or a hydrogenated silicon oxycarbide.

17. The method of claim 11, wherein the forming a dielectric layer comprises depositing the dielectric layer at a temperature of less than 350° C.

18. The method of claim 11, wherein the forming a plurality of memory cells comprises:

forming a charge storage element configured to store two bits of information for each memory cell.

* * * * *